(12) United States Patent
Yang et al.

(10) Patent No.: US 9,712,130 B2
(45) Date of Patent: *Jul. 18, 2017

(54) PASSIVE DEVICE CELL AND FABRICATION PROCESS THEREOF (71) Applicant: MediaTek Inc., Hsin-Chu (TW)

(72) Inventors: Ming-Tzong Yang, Baoshan Township, Hsinchu County (TW); Cheng-Chou Hung, Hukou Township, Hsinchu County (TW); Tung-Hsing Lee, New Taipei (TW); Wei-Che Huang, Zhudong Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/874,888

(22) Filed: Oct. 5, 2015

(65) Prior Publication Data
US 2016/0028359 A1  Jan. 28, 2016

Related U.S. Application Data

(63) Continuation of application No. 13/804,206, filed on Mar. 14, 2013, now Pat. No. 9,190,976.

(Continued)

(51) Int. Cl.
*H03H 7/01* (2006.01)
*H03H 3/00* (2006.01)
(Continued)

(52) U.S. Cl.
CPC ....... *H03H 7/0115* (2013.01); *H01P 1/20381* (2013.01); *H01P 7/082* (2013.01); *H03H 3/00* (2013.01)

(58) Field of Classification Search
CPC .... H03H 3/00; H03H 7/0115; H01P 1/20381; H01P 7/082
(Continued)

(56) References Cited

U.S. PATENT DOCUMENTS 4,261,263 A * 4/1981 Coultas ................ F42B 3/18
102/202.7
6,938,325 B2 * 9/2005 Tanielian ................ H01Q 3/44
29/417

(Continued)

FOREIGN PATENT DOCUMENTS

CN          101103489          1/2008

OTHER PUBLICATIONS

Dong, Y., et al.; "Design and Characterization of Miniaturized Patch Antennas Loaded with Complementary Split-Ring Resonators;" IEEE Transactions on Antenna and Propagation; vol. 60; No. 2; Feb. 2012; pp. 772-785.

*Primary Examiner* — Stephen E Jones
*Assistant Examiner* — Rakesh Patel
(74) *Attorney, Agent, or Firm* — McClure, Qualey & Rodack, LLP (57) ABSTRACT

An implementation of the invention is directed to a passive device cell having a substrate layer, and intermediary layer formed above the substrate layer, and a passive device formed above the intermediary layer. The intermediary layer includes a plurality of LC resonators and a plurality of segmented conductive lines, wherein the plurality of segmented conductive lines are disposed between the plurality of LC resonators.

16 Claims, 8 Drawing Sheets

Related U.S. Application Data

(60) Provisional application No. 61/622,310, filed on Apr. 10, 2012.

(51) Int. Cl.
*H01P 1/203* (2006.01)
*H01P 7/08* (2006.01)

(58) Field of Classification Search
USPC ............... 333/175, 185, 219, 204, 205, 235
See application file for complete search history.

(56) References Cited

U.S. PATENT DOCUMENTS

| | | | |
|---|---|---|---|
| 7,106,494 B2 | 9/2006 | Osipov et al. | |
| 7,403,683 B2 * | 7/2008 | Chern | B82Y 20/00 310/313 R |
| 7,492,329 B2 * | 2/2009 | Wang | H01Q 13/28 343/700 MS |
| 7,692,840 B2 | 4/2010 | Kuekes et al. | |
| 8,674,792 B2 * | 3/2014 | Yonak | H01P 1/20381 333/205 |
| 9,190,976 B2 * | 11/2015 | Yang | H03H 7/0115 |
| 2001/0038325 A1 | 11/2001 | Smith et al. | |
| 2006/0152430 A1 | 7/2006 | Seddon et al. | |

* cited by examiner

PASSIVE DEVICE CELL AND FABRICATION PROCESS THEREOF

CROSS REFERENCE TO RELATED APPLICATIONS

This application is a Continuation of U.S. patent application Ser. No. 13/804,206, filed on Mar. 14, 2013, now U.S. Pat. No. 9,190,976, which claims priority to provisional patent application No. 61/622,310, filed on Apr. 10, 2012, the entirety of which is incorporated by reference herein.

BACKGROUND

1. Technical Field

The invention relates generally to a passive device, and more particularly, to a passive device that is separated from a substrate layer by an intermediary layer.

2. Related Art

Passive devices are circuit components that are incapable of generating power gain; in other words, they cannot amplify signals. Capacitors, inductors, and resistors are some well-known examples of passive devices. Generally speaking, in an integrated circuit (IC), passive devices are formed on a layer above the substrate. When the current flowing through a passive device is changing, the time-varying current will induce eddy currents in the underneath substrate, causing some energy to be wasted. The energy waste may deteriorate the passive device's performance.

SUMMARY

The invention provides embodiments that may enhance a passive device' performance and make the fabrication process thereof more robust.

An embodiment of the invention provides a passive device cell. The passive device cell has a substrate layer, a passive device, and an intermediary layer formed between the substrate layer and the passive device. The intermediary layer includes a plurality of LC resonators.

Another embodiment of the invention provides a passive device cell. The passive device cell has a substrate layer, a passive device, and a metamaterial layer formed between the substrate layer and the passive device.

Still another embodiment of the invention provides a passive device fabrication process. The process includes a step of forming an intermediary layer above a substrate layer and a step of forming a passive device above the intermediary layer. The intermediary layer includes a plurality of LC resonators.

Other features of the invention will be apparent from the accompanying drawings and from the detailed description which follows.

BRIEF DESCRIPTION OF THE DRAWINGS

The invention is fully illustrated by the subsequent detailed description and the accompanying drawings, in which like references indicate similar elements.

DETAILED DESCRIPTION

Figure 1:
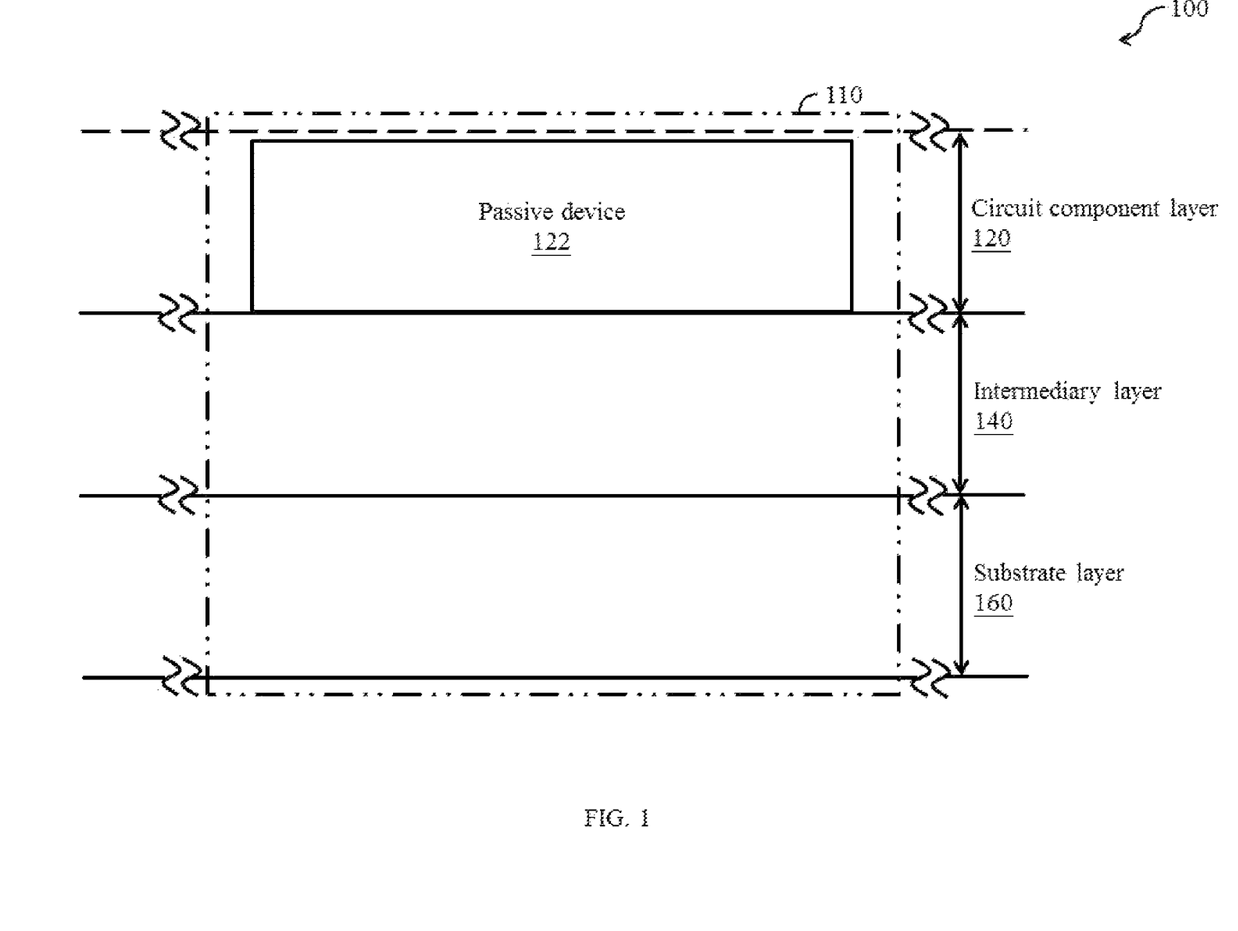
FIG. 1 shows an exemplary cross-sectional view of a passive device cell in an IC according to an embodiment of the invention.

FIG. 1 shows an exemplary cross-sectional view of a passive device cell 110 of an IC 100 according to an embodiment of the invention. The IC 100 may include both passive devices and active devices, or include passive devices but not active devices. If it does not include active devices, the IC 100 may be referred to as an integrated passive device (IPD).

The IC 100 has at least three layers, including a circuit component layer 120, an intermediary layer 140, and a substrate layer 160. The intermediary layer 140 lies between the circuit component layer 120 and the substrate layer 160. Each of these layers may have one or multiple sub-layers. The circuit component layer 120 and the substrate layer 160 may stretch throughout the whole IC 100. The intermediary layer 140 may stretch throughout the whole IC 100 or stretch in the IC 100 to wherever passive devices are formed above.

The passive device cell 110 is a part of the IC 100 used to form a passive device 122. Specifically, in the part of the circuit component layer 120 within the cell 110, the passive device 122 is formed. Because the passive device 122 may be a resistor, a capacitor, an inductor, or another kind of passive device, FIG. 1 only uses a rectangle to represent the cross-sectional view of the passive device 122. Other area in the circuit component layer 120 shown in FIG. 1 but not occupied by the passive device 122 may have been worn down or etched out.

Figure 2:
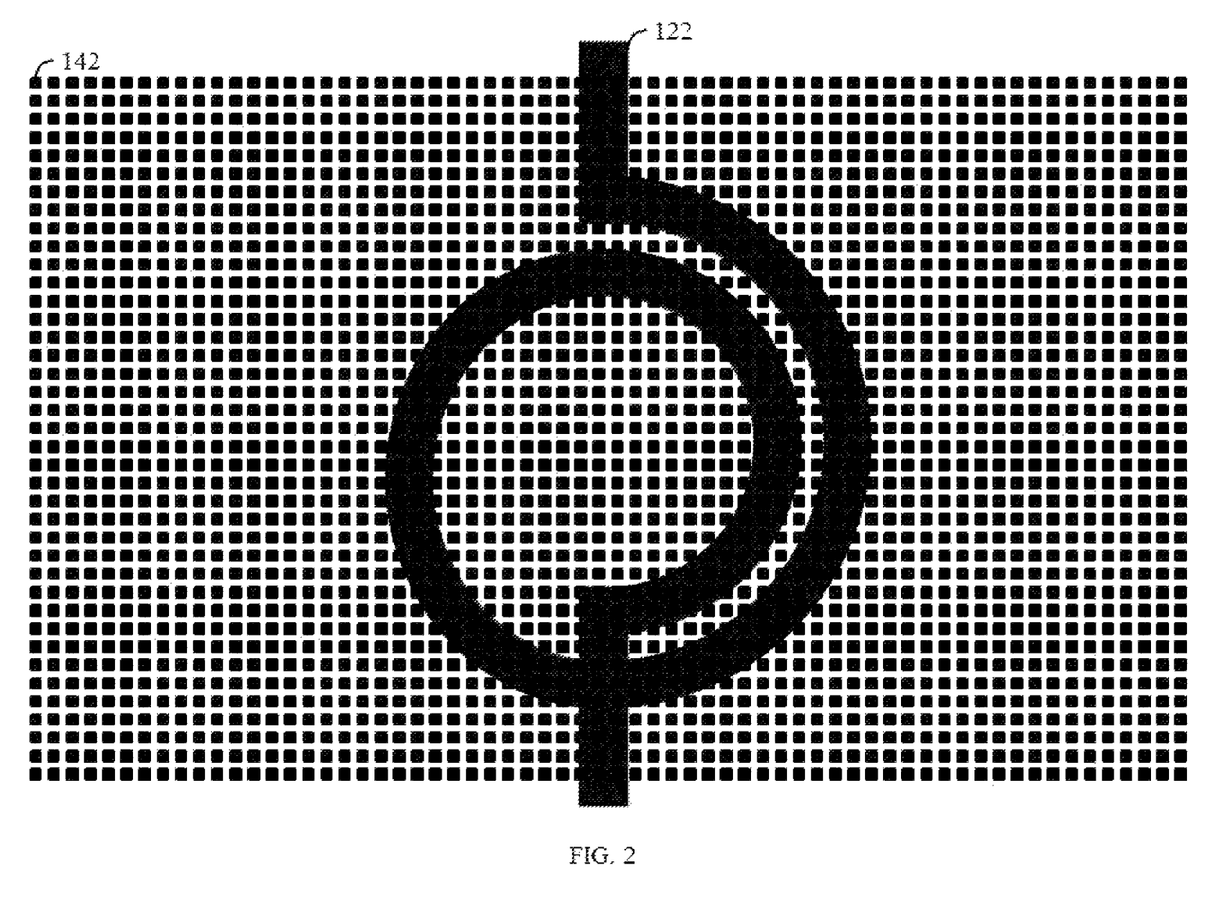
FIG. 2 and FIG. 3 show two exemplary top views of the passive device cell depicted in FIG. 1.
Figure 3:
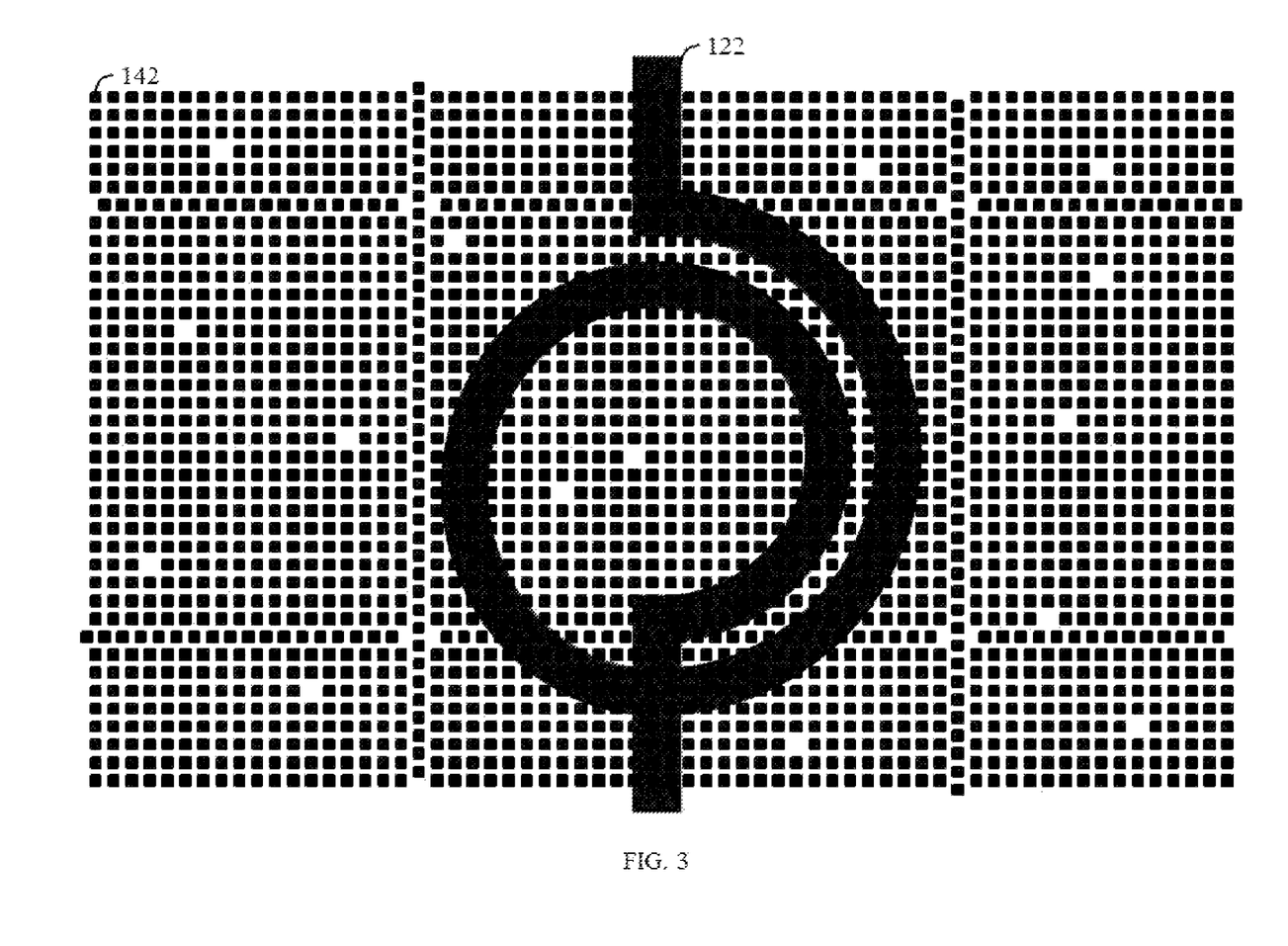

The intermediary layer 140 may be a metamaterial layer, which may also be referred to as a negative index material layer or a left-handed medium layer. FIG. 2 and FIG. 3 shows exemplary top views of the passive device cell 110 of FIG. 1. The passive device 122 shown in these examples is an inductor. Furthermore, each of small solid rectangles represents an LC resonator formed in the intermediary layer 140. To avoid distraction, only one of the LC resonators is indexed as 142; other not indexed LC resonators may also be referred to as LC resonators 142.

As FIG. 2 and FIG. 3 indicate, the intermediary layer 140 is a layer in which LC resonators 142 are formed. Specifically, beneath each passive device (such as the passive device 122) formed in the circuit component layer 120, there may be a plurality of LC resonators 142 formed in the intermediary layer 140. In the example shown in FIG. 2, the LC resonators 142 constitute a two dimensional array in the intermediary layer 140. In the example shown in FIG. 3, the LC resonators 142 do not constitute a uniform array in the intermediary layer 140 but are arranged less regularly.

The area occupied by the LC resonators 142 may be larger than, equal to, or smaller than, the area occupied by the above passive device 122. The LC resonators 142 may be on a plane substantially parallel to the three layers 120, 140, and 160. Depending on the size of the passive device 122 and the sizes of the LC resonators 142, the LC resonators 142 beneath the passive device 122 may have hundreds or even thousands or member resonators. The optimal size and configuration of the LC resonators 142 may be determined through electromagnetic (EM) simulation. As an example, each of the LC resonators 142 is more than 100 times smaller than the passive device 122.

Figure 4:
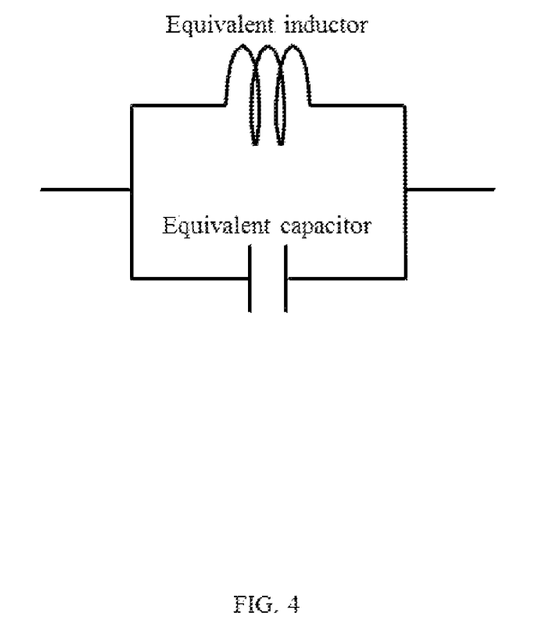
FIG. 4 shows an exemplary equivalent circuit of an LC resonator.

Each LC resonator 142 may have an equivalent circuit that includes at least an equivalent inductor and an equivalent capacitor connected in parallel. An example of such an equivalent circuit is depicted in FIG. 4. To make the LC resonator 142 equivalent to the circuit depicted in FIG. 4, the LC resonator 142 may have at least a pair of conductive components, such as a pair of metal segments, adjacent to and electrically isolated from each other.

Figure 5:
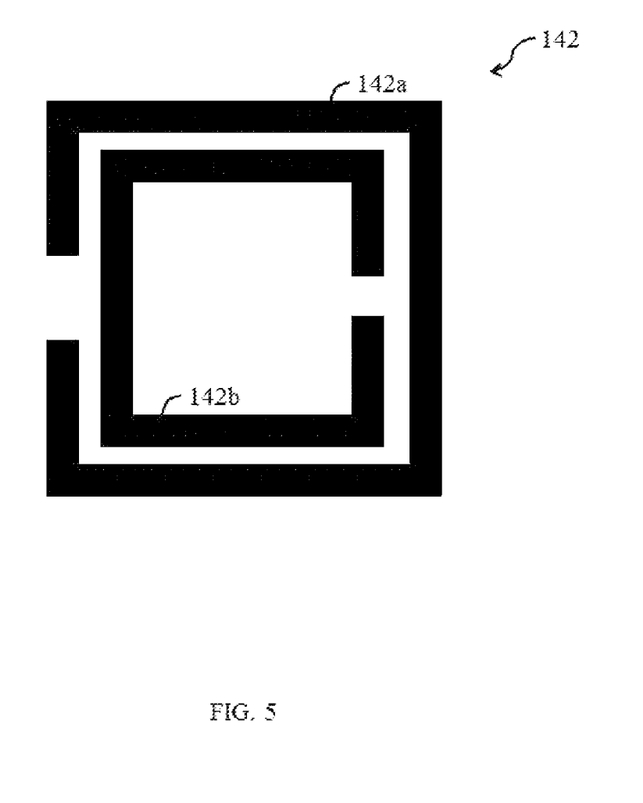
FIG. 5 shows an exemplary top view of an LC resonator embodied by a split-ring resonator.

For example, each LC resonator 142 may be a split-ring resonator (SRR). The SRR may include at least a pair of conductive split-rings. The two splits of the pair of conductive split-rings may face two different directions (e.g. two opposite directions). If the two conductive split-rings are on a same plane, one of them may be substantially encircled by the other. But for its split, each of the conductive split-rings may resemble a circle, a rectangle, or another geometric figure. FIG. 5 shows an exemplary top view of an LC resonator 142 embodied by an SRR. This LC resonator 142 has a first conductive split-ring 142a and a second conductive split-ring 142b. The two conductive split-rings 142a and 142b both resemble letter "C" but face two opposite directions. The second conductive split-ring 142b is substantially encircled by the first conductive split-ring 142a.

Figure 6:
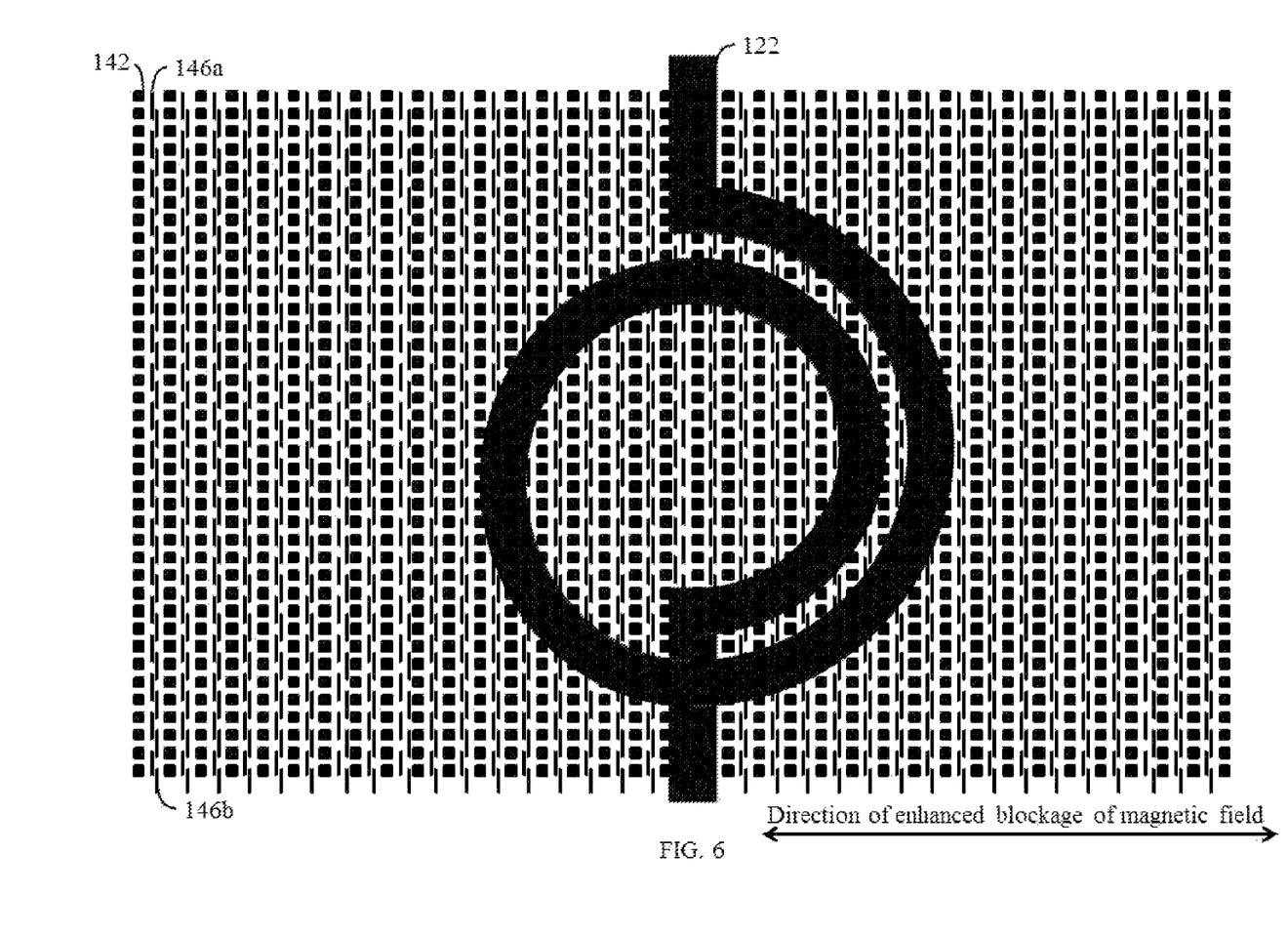
FIG. 6 and FIG. 7 show two other exemplary top views of the passive device cell depicted in FIG. 1.
Figure 7:
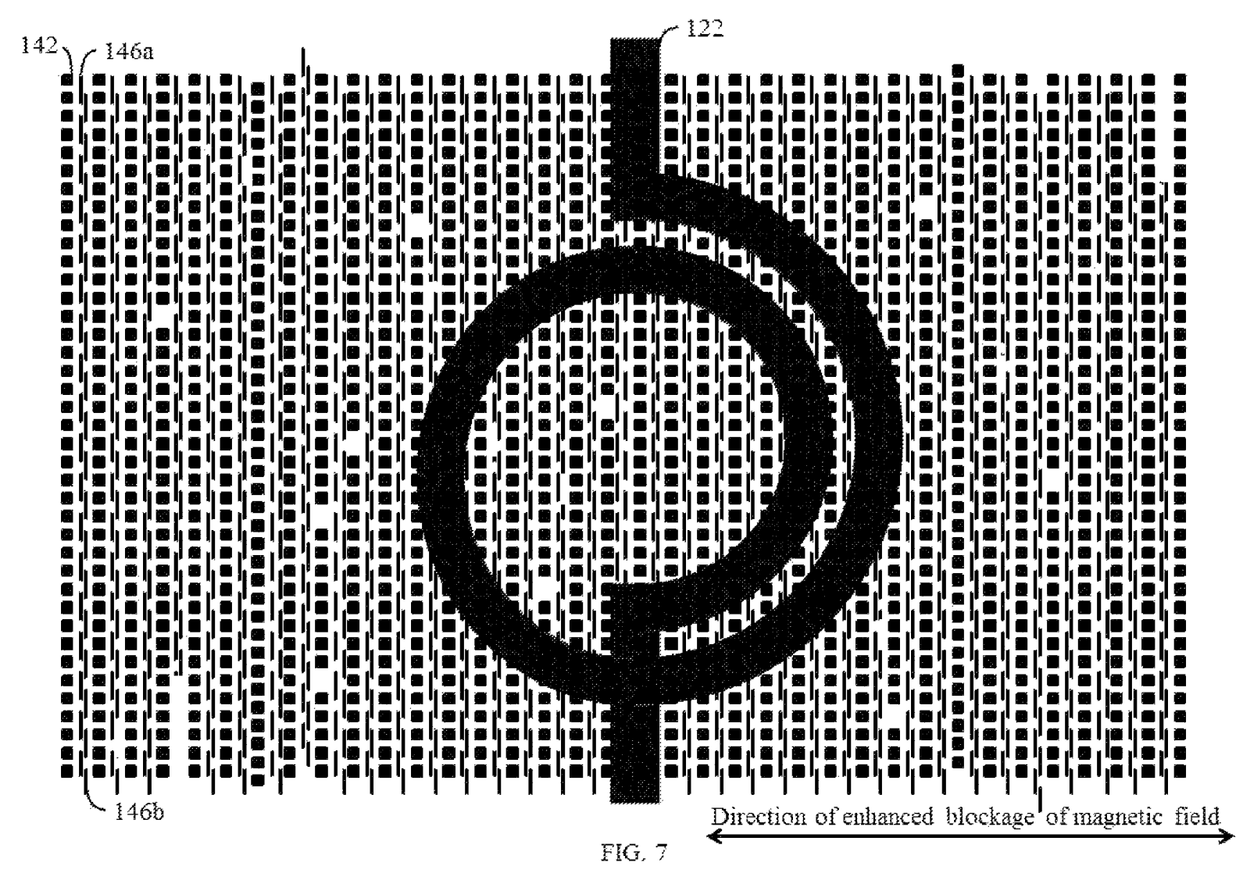

FIG. 6 and FIG. 7 show two other exemplary top view of the passive device cell 110 of FIG. 1. Unlike the examples shown in FIG. 2 and FIG. 3, in these two examples the intermediary layer 140 is formed with not only LC resonators 142 but also pairs of dashed conductive lines. Each of the dashes forming these dashed lines may be a metal segment isolated from other metal segments. To avoid distraction, only a pair of dashed conductive lines is indexed in each of FIG. 6 and FIG. 7; the indexed lines include a first dashed conductive line 146a and a second dashed conductive line 146b. Each pair of dashed conductive line not labeled in FIG. 6 or FIG. 7 may also be referred to as dashed conductive lines 146a and 146b. The first dashed conductive line 146a and the second dashed conductive line 146b are beside and substantially parallel to each other. Furthermore, in these examples, the gaps between of the first dashed conductive line 146a are not aligned with the gaps between of the second dashed conductive line 146b. The pair of dashed conductive lines 146a and 146b may be equivalent to plenty of tiny LC resonators.

In the example shown in FIG. 6, the LC resonators 142 constitute a two dimensional array in the intermediary layer 140. In the example shown in FIG. 7, the LC resonators 142 do not constitute a uniform array in the intermediary layer 140; instead, the LC resonators 142 and dashed conductive lines 146a and 146b are arranged less regularly in FIG. 7. Although each pair of dashed conductive lines 146a and 146b may be straight lines, they may also be curved lines that are parallel to each other.

Figure 8:
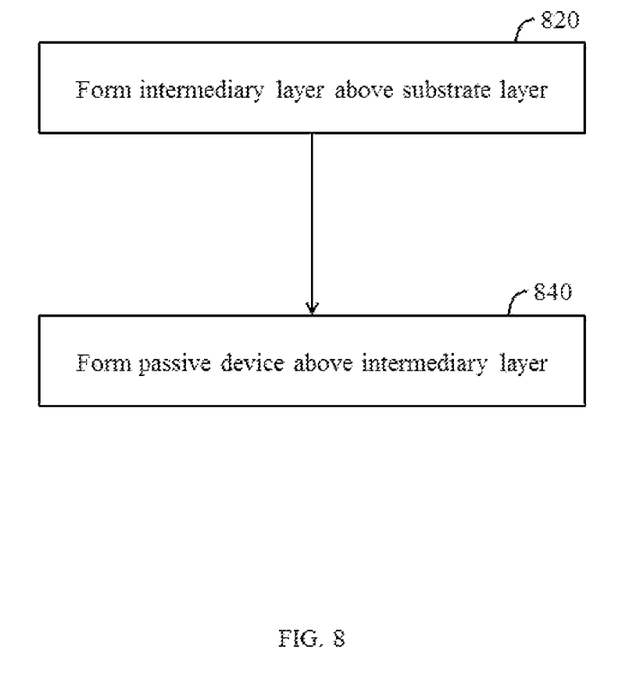
FIG. 8 shows a simplified flowchart of a process for fabricating the passive device cell of FIG. 1.

FIG. 8 shows a simplified flowchart of a process for fabricating the passive device cell 110. This figure depicts only the steps directly related to the understanding of the invention. Each of the steps depicted in FIG. 8 may include multiple sub-steps. First, at step 820, the intermediary layer 140 is formed above the substrate layer 160. Specifically, this step may involve the doping or deposition of conductive material onto a semiconductor wafer to form the conductive patterns described above. Then, at step 840, the passive device 122 is formed above the intermediary layer 140. Step 840 may be performed stably because the intermediary layer 140, which is relatively more solid, is underneath the passive device 122.

The inclusion of the intermediary layer 140 between the passive device 122 and the substrate layer 160 may have several advantages. First, this may enhance the passive device 122's performance. For example, whenever the current flowing through the passive device 122 is changing, this time-varying current may induce magnetic field lines around the passive device 122. The LC resonators in the intermediary layer 140 may serve as tiny LC tanks and prevent some of the magnetic field lines from entering the part of the substrate layer 160 underneath the passive device 122. As to the pairs of dashed conductive lines depicted in FIG. 6 and FIG. 7, they may enhance the blockage of magnetic field lines, especially in the direction depicted in the figures. Therefore, the intermediary layer 140 may decrease the amount of eddy currents induced in the part of the substrate layer 160 and as a result reduce energy waste. With less energy wasted, the passive device 122 may have an enhanced performance Q.

Second, the repetitive patterns in the intermediary layer 140 may make the foundations underneath the passive device 122 more rigid. Even if some parts of the circuit component layer 120 have been worn down or etched out, the revealed upper surface of the intermediary layer 140 may still be relatively flat. This means that the inclusion the intermediary layer 140 may make the fabrication processes, especially the chemical-mechanical polishing (CMP) process, of the IC 100 more robust. Third, the intermediary layer 140 may make it unnecessary to use high-resistance (HR) substrate, pattern ground shielding (PGS), or thick metal for reducing eddy currents, and hence may cut down on the overall fabrication costs. Fourth, when being compared with PGS, the tiny repetitive patterns in the intermediary layer 140 may have relatively smaller parasitic capacitances.

In the foregoing detailed description, the invention has been described with reference to specific exemplary embodiments thereof. It will be evident that various modifications may be made thereto without departing from the spirit and scope of the invention as set forth in the following claims. The detailed description and drawings are, accordingly, to be regarded in an illustrative sense rather than a restrictive sense.

What is claimed is:

1. A passive device cell, comprising:
   a substrate layer;
   an intermediary layer formed above the substrate layer, the intermediary layer comprising a plurality of LC resonators and a plurality of segmented conductive lines,
   wherein the plurality of segmented conductive lines are disposed between the plurality of LC resonators; and
   a passive device formed above the intermediary layer, wherein the plurality of segmented conductive lines are disposed in pairs, and each of the pairs of segmented conductive lines comprises a first segmented conductive line and a second segmented conductive line beside and substantially parallel to each other, and gaps between the first segmented conductive line are not aligned with gaps between the second segmented conductive line.

2. The passive device cell of claim 1, wherein the size of each of the LC resonators is more than 100 times smaller than the size of the passive device.

3. The passive device cell of claim 1, wherein each of the plurality of LC resonators comprises a pair of conductive components adjacent to and not physically connected to each other.

4. The passive device cell of claim 3, wherein the pair of conductive components of each of the plurality of LC resonators are a pair of conductive split-rings, each of the pair of conductive split-rings has a split, the two splits of the pair of conductive split-rings face two opposite directions, and one of the pair of conductive split-rings is substantially encircled by the other.

5. The passive device cell of claim 1, wherein the plurality of LC resonators constitute a two dimensional array in the intermediary layer.

6. A passive device cell, comprising:
a substrate layer;
a metamaterial layer formed above the substrate layer, the metamaterial layer comprising a plurality of LC resonators and a plurality of segmented conductive lines other than the LC resonators, wherein the plurality of segmented conductive lines other than the LC resonators are disposed between the plurality of LC resonators; and
a passive device formed above the metamaterial layer,
wherein the size of each of the plurality of LC resonators is more than 100 times smaller than the size of the passive device.

7. The passive device cell of claim 6, wherein the plurality of LC resonators constitute a two dimensional array in the metamaterial layer.

8. The passive device cell of claim 6, wherein the plurality of segmented conductive lines other than the LC resonators is disposed in pair, and each of the pairs of plurality of segmented conductive lines other than the LC resonators comprises a first segmented conductive line and a second segmented conductive line beside and substantially parallel to each other, and gaps between the first segmented conductive line are not aligned with gaps between the second segmented conductive line.

9. The passive device cell of claim 6, wherein each of the plurality of LC resonators is a split-ring resonator.

10. The passive device cell of claim 9, wherein the split-ring resonator of each of the plurality of LC resonators comprises a pair of conductive split-rings, and each of the conductive split-rings has a split.

11. The passive device cell of claim 10, wherein the two splits of the pair of conductive split-rings face two opposite directions, and one of the pair of conductive split-rings is substantially encircled by the other.

12. A passive device fabrication process, comprising:
forming an intermediary layer above a substrate layer, the intermediary layer comprising a plurality of LC resonators and a plurality of segmented conductive lines, wherein the plurality of segmented conductive lines are disposed between the plurality of LC resonators; and
forming a passive device above the intermediary layer,
wherein the plurality of segmented conductive lines are disposed in pairs, and each of the pairs of plurality of segmented conductive lines comprises a first segmented conductive line and a second segmented conductive line beside and substantially parallel to each other, and gaps between the first segmented conductive line are not aligned with gaps between the second segmented conductive line.

13. The process of claim 12, wherein the plurality of LC resonators constitute a two dimensional array in the intermediary layer.

14. The process of claim 12, wherein the pair of conductive components of each of the plurality of LC resonators are a pair of conductive split-rings, each of the pair of conductive split-rings has a split, the two splits of the pair of conductive split-rings face two opposite directions, and one of the pair of conductive split-rings is substantially encircled by the other.

15. The process of claim 12, wherein each of the plurality of LC resonators comprises a pair of conductive components adjacent to and not physically connected to each other.

16. The process of claim 12, wherein the size of each of the plurality of LC resonators is more than 100 times smaller than the size of the passive device.

* * * * *